(12) United States Patent
Michon et al.

(10) Patent No.: US 6,804,099 B2
(45) Date of Patent: Oct. 12, 2004

(54) CABLE NETWORK INTERFACE CIRCUIT

(75) Inventors: Joel Stephen Michon, Englewood, CO (US); Kevin John Lynaugh, Carlsbad, CA (US); Hans Habermeier, Egwell (DE)

(73) Assignee: Microtune (Texas), L.P., Plano, TX (US)

( * ) Notice: Subject to any disclaimer, the term of this patent is extended or adjusted under 35 U.S.C. 154(b) by 449 days.

(21) Appl. No.: 09/826,292

(22) Filed: Apr. 4, 2001

(65) Prior Publication Data

US 2002/0145840 A1 Oct. 10, 2002

(51) Int. Cl.⁷ .................................................. H02H 9/00
(52) U.S. Cl. ......................... 361/91.1; 361/56; 361/58; 361/113; 361/119
(58) Field of Search .............................. 361/18, 56, 58, 361/113, 111, 91.1, 115, 119, 127, 120

(56) References Cited

U.S. PATENT DOCUMENTS 3,925,737 A * 12/1975 Headley ..................... 333/100
5,834,989 A    11/1998 Romerein et al.
5,845,190 A *  12/1998 Bushue et al. .............. 725/130
6,144,399 A *  11/2000 Manchester et al. ........ 725/127
D469,742 S  *  2/2003  Michon et al. ............. D13/151

FOREIGN PATENT DOCUMENTS

EP        0 200 291 A2    12/1986
WO        WO-96/29825 A    9/1996

OTHER PUBLICATIONS

U.S. patent application Ser. No. 09/788,957, Lynaugh, filed Feb. 17, 2001.
U.S. patent application Ser. No. 29/139,640, Habermeier et al., filed Apr. 4, 2001.
International Search Report Issued Sep. 18, 2002 PCT/IB 02/02099.

* cited by examiner

*Primary Examiner*—Stephen W. Jackson
(74) *Attorney, Agent, or Firm*—Fulbright & Jaworski LLP

(57) ABSTRACT

An input section of an RF interface is shown in conjunction with a tuner circuit. The input, in one embodiment, is constructed using co-planner wave guide techniques and serves to provide low return loss, low insertion loss, high voltage protection, all within a single housing without causing RF interference problems.

47 Claims, 2 Drawing Sheets

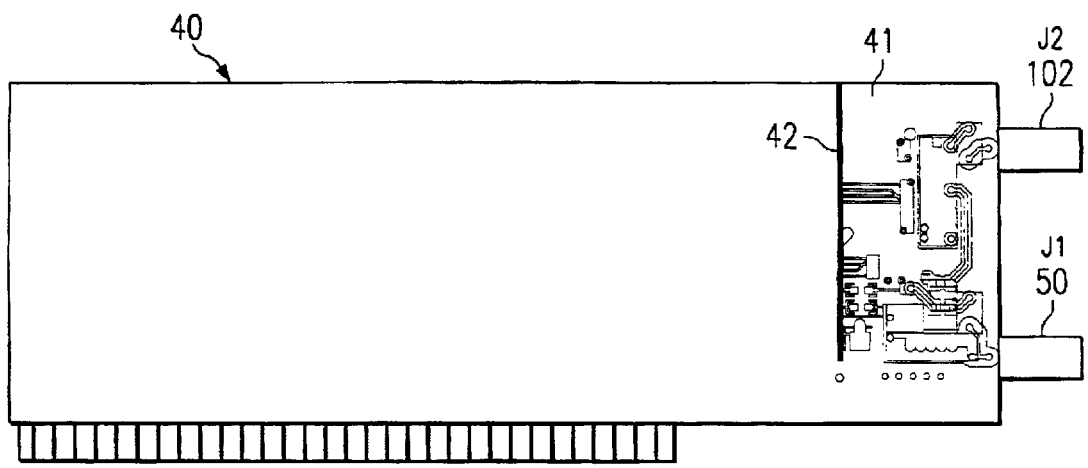
FIG. 4
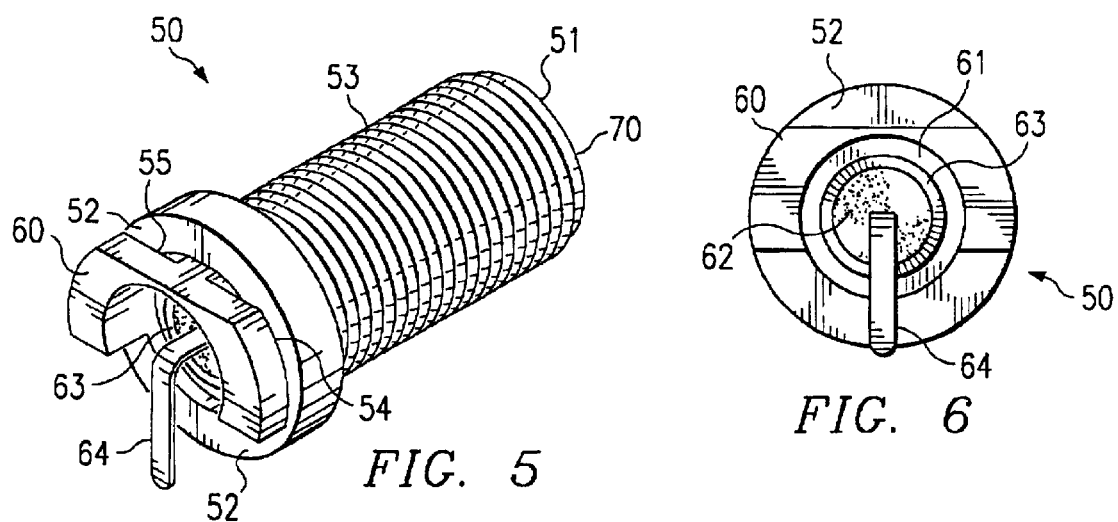
FIG. 5
FIG. 6
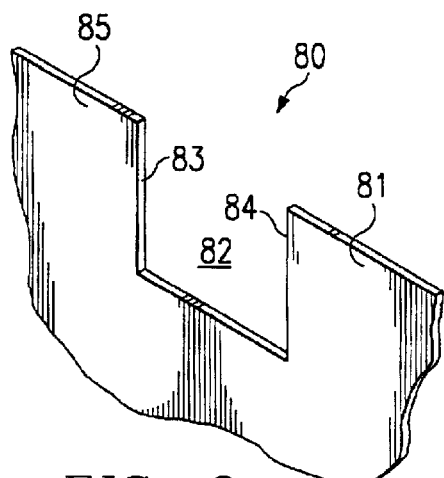
FIG. 8
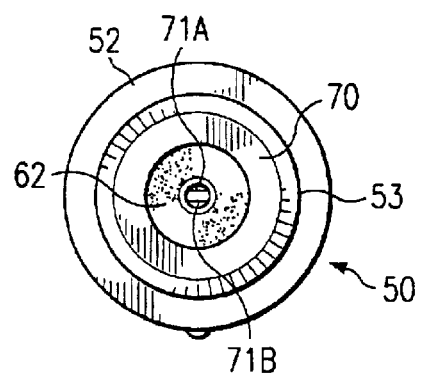
FIG. 7

CABLE NETWORK INTERFACE CIRCUIT

RELATED APPLICATIONS

This application is related to commonly assinged U.S. patent application Ser. No. 09/788,957 entitled "SYSTEM AND METHOD FOR TEMPERATURE COMPENSATED IF AMPLIFIER" and concurrently filed and commonly assinged U.S. Design patent application Ser. No. 29/139,640 entitled "IMPROVED COAXIAL CONNECTOR", the disclosures of which are hereby incorporated herein by reference.

TECHNICAL FIELD

This invention relates to RF cable distribution network systems and more particularly to an interface circuit for use with such cable networks, and even more particularity to such a system using co-planer wave guide techniques.

BACKGROUND

Cable TV networks are well-known and have been used for years to distribute RF signals to TV sets over coaxial cable. Traditionally, this has been a "broadcast" type network for one direction RF transmission. This traditional network is now being converted into a bidirectional network and, at the same time, the data bandwidth is being increased as much as possible. Coupled with this is the requirement that the power be delivered through the cable and that digital data be added/removed from the RF transmission, all without reducing the transmission quality of the RF signal to the TV or other connected devices. This is a lot to ask of an interface circuit, particularly where low cost and low radiation susceptibility are important.

Traditionally, the RF coaxial cable terminates at the TV set. Now it is required to insert a junction box into the cable at some point for each terminating location so as to be able to remove the power and add/remove other signals from the cables.

One problem that needs to be solved is to have minimum RF insertion loss when the junction box is inserted into the existing RF cable. In addition, the return loss of both connectors (the input connection and the connection to the TV set) must be greater than 15 dB. Also, the input power must be removed. In terms of safety, the box must have the ability to withstand lightening which is defined as microsecond spikes with an 80 microsecond half-decay point. The voltage spike levels can reach 6000 volts: Line crosses, when high voltage, such as 600 VAC, can get on RF center conductor, must be handled. Also, there must be some method of suspending service by remote signals applied to the RF line. In addition, because of the power delivery aspect, UL Creepage and Clearance must be met. All of this must be activated while still maintaining low cost manufacturing costs which equates to a low cost manufacturing process.

Typically, what has been done is that there have been different circuits to solve each of those problems. Thus, there are in-line power tap circuits and tuners on printed and circuit boards with connectors thereon which can cut off the RF signal when desired. Usually, these solutions have been add-ons to the tuner and are typically external to the tuner board. To date, with each add-on handling only a subset of the problems. Today there does not exist an integrated tuner solution to the problems discussed above.

SUMMARY OF THE INVENTION

The present invention is directed to a system and method which meets all the RF junction box requirements and does so in an economic manner. Our invention relies, in part, on what is called a co-planer wave guide, which is a transmission line technique applied to solve a unique set of problems. The conventional approach would be to use micro strip lines for the input of the tuner. This approach is faulty because of the immediate proximity of many parasitic elements in the RF path. These parasitic elements include walls, relays, capacitors, and other elements which impede the RF performance.

The co-planer wave guide techniques used in one embodiment pulls down the radiation fields and yields much better performance than prior circuits. Lighting protection, line cross protection, AC tap circuitry, relay cut off circuitry, low return and insertion losses, outdoor F-connectors are all achieved within a single housing where an interface is provided to a digital processing circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIG. 4 shows the placement of the co-planer elements within one embodiment of the RF tuner;

FIG. 5 shows one embodiment of a coaxial connector adapted for receipt of power from the cable network;

FIG. 6 shows the inner end view of the connector;

FIG. 7 shows the outer end of the connector; and

FIG. 8 shows a portion of the housing on which the connector is mounted.

DETAILED DESCRIPTION

Figure 1:
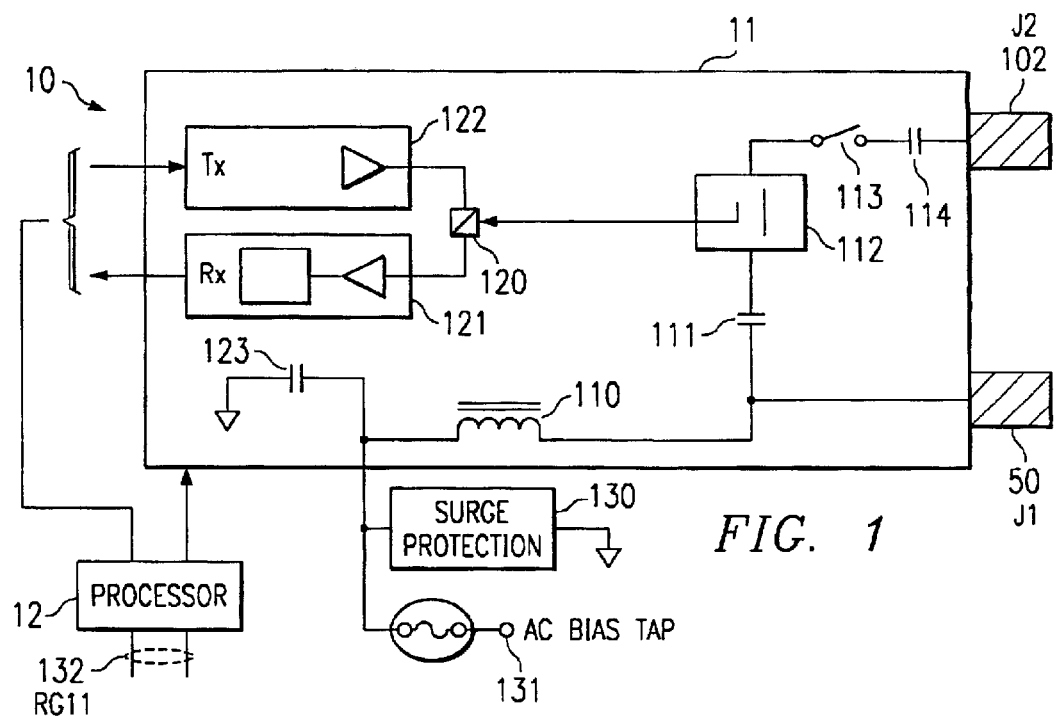
FIG. 1 shows, in block diagram form, one embodiment of the front-end of an RF tuner interface system.

Turning now to FIG. 1, there is shown system 10 which has an input 101 (connector J1) from the RF cable plant which brings in signals in the range of 54 to 862 Mega-Hertz (MHz) and provides outward signals in the range of 5 MHz to 42 MHz. The signals into connector J1 must pass through circuit 11 to output 102 (connector J2) with a very low insertion loss and very high return loss throughout the range of 5 MHz to 862 MHz. In a typical operation, the input signal comes from the cable plant on connector J1 and passes through circuit 11 to connector J2 and goes to the customer's home which could be a TV, cable modem or any other device connected to the cable.

Circuit 11 receives the input RF signals from connector J1 and taps off the RF signals and frequency translates the signals to an IF frequency for subsequent processing. This processing can be on board or can be separate through processor 12. Another aspect of the input from connector J1 is that, in some instances, AC power (typically in the range of 93 volts at 60 Hertz) must be tapped off the center conductor of the coax cable and delivered to AC bias tap 131. As discussed above, there could be lightning hits, crossed wires (voltages greater than 400 VAC volts) and other environmental elements which must be addressed so as to prevent dangerous conditions to people or to the equipment connected to the circuit.

Under intended situations where the center conductor is energized, the AC voltage on the connector goes through RF choke 110 to AC bias tap 131 and is rectified for generation of the DC power for the device or for an externally connected device. RF choke 110 is high impedance at 5 MHz and is designed to resonate with elements 123 and 111 in a high pass filter to yield the high return loss that we need at 5 MHz. Elements 123, 111 and 114 are all safety rated capacitors (safety cap) so they can handle very high voltages that might be present under dangerous conditions. Directional coupler 112 gives low insertion loss between the J1, J2 connectors which also couples to tuner 120 which could, for example, be a diplex filter acting as a high and low pass filter. Filter 120 energizes and drives receiver 121 which can be, for example, the downstream single conversion tuner 121. Element 122 is the upstream transmitter which transmits modulated signals through directional coupler 112 back out through capacitor 111 to connector J1 for communication back to the headend.

Continuing through the RF path, from input connector J1, the signal passes through directional coupler 112, through cable denial relay contacts 113, capacitor 114 to connector J2. The cable denial relay is controlled by the cable plant and operators can send a signal which passes through receiver 121, demodulated and passed to processor 12. Processor 12 then could operate the relay to open the RF line to connector J2.

The co-planer wave guide technique is advantageously used from connector J1 to capacitor 111 and to inductor 110, and also from capacitor 111 to directional coupler 112 and from directional coupler 112 to contact 113; and from contact 113 to capacitor 114; and from capacitor 114 to connector J2. The purpose of the Co-Planer technique is to minimize the parasitic effects of circuit elements which are closer than 10 trace widths from the center conductor. In this circuit, there would be elements such as the relay, safety capacitors, the connectors, the wall, the housing, all other elements that are in close proximity to the transmission line and which impact the insertion loss and return loss of circuit.

Note that the inventive concepts of our system and method relate to the "front end" of the junction box which feeds signals 10 and receives signals from processor 12. Thus, any design of receiver 121, transmitter 122 and processor 12 will work with the invention. Also, in some situations, bidirectional transmission may not be required and thus transmitter 122 or receiver 121 may not be present.

In the best mode, it is contemplated that circuit 11 would process the RF signals and provide a digital output stream of data and/or control signals to external processor 12. Also, circuit 12 would receive a stream of data and/or control signals from processor 12. However, processor 12 could be unified with circuit 11, or perhaps if the transmit/receive circuits could be located external to circuit 11 or within processor 12.

Figure 2:
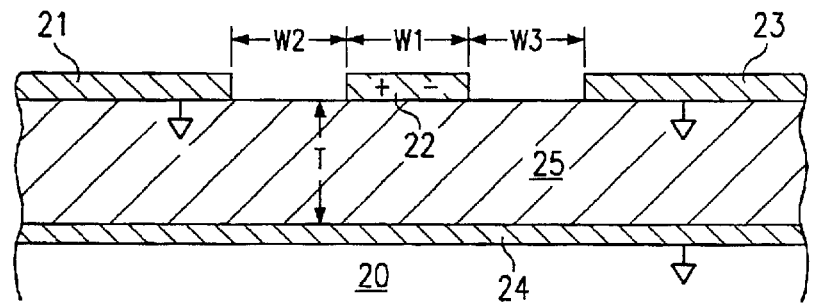
FIG. 2 shows a cross section view of the co-planer wave guide techniques used in the interface system.

FIG. 2 is an overview of the co-planer wave guide technique used. This shows a simple cross-section of a two-sided copper-clad printed circuit board 20 with top surface 21 and bottom surface 24 around center 25. W1 and W2 are voids such that copper has been removed between segments 21 and 22 and also between segments 22 and 23.

Figure 3:
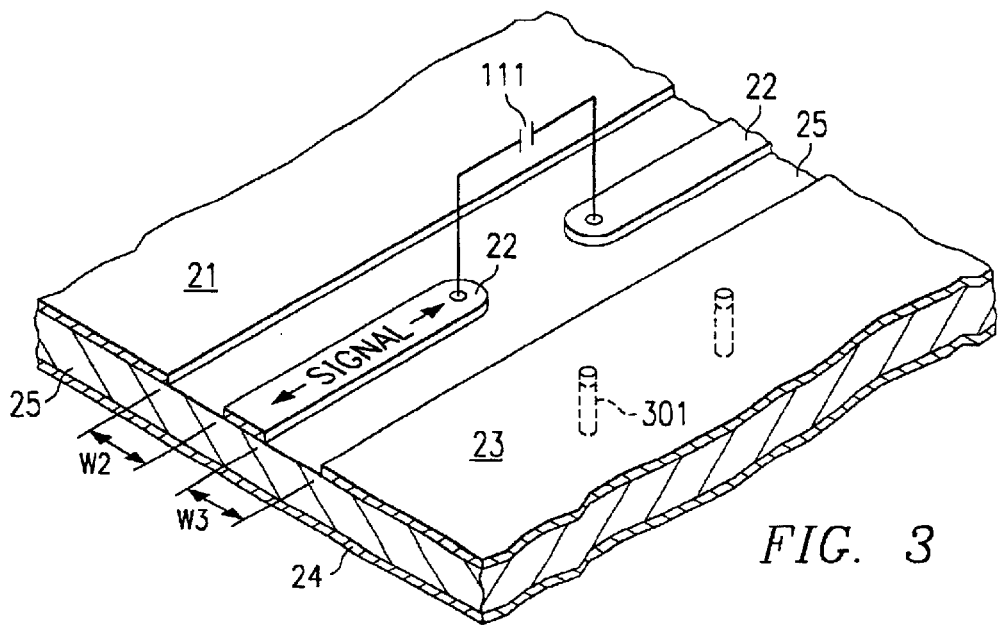
FIG. 3 shows a topographical view of the co-planer technique shown in FIG. 2.

As shown in FIG. 3, the RF signal propagates down segment 22 to capacitor 111. The fields propagate out and are terminated by elements which produces a very repeatable transmission line which holds the electric field rather tightly. A ground via 301 is used in copious quantities to achieve low RF impedance between layers 23, 24 and 21. Thus, the field is less influenced by structures that are in close proximity to this transmission line. The dielectric material thickness-T (FIG. 2) in one embodiment is FR4 which can be a low-cost fiberglass material. This material typically has a problem in low-cost production techniques as a dielectric constant because it varies significantly over production as does the thickness T. The co-planer technique is compatible with those type of variations and provides good performance. The dielectric constant is not controlled in that particular material but it is obviously important in terms of calculating the dimensions of the circuit. In our circuit we have found T to be 0.062 inches.

Returning now to FIG. 1, let us now address provisions for lightning, line cross and ground currents. The circuit must have the ability to pass 80 amps of continuous ground current between connectors J1 and J2. The actual housing is designed in case of lightning, capacitor 123 coupled with inductor 110 provides a low pass filter for the lightning energy, to pass to bias tap 120 which includes a surger circuit for capturing that energy. The same thing would happen with an AC line cross except in-line fuse 133 would open disrupting the current flow from the hazardous condition. Advantageously, the AC bias tap location is outside of the tuner circuit.

Another difficult parameter to meet is the UL Creepage and Clearance as contained in UL standard 1950 which is 67 mil clearance from high voltage surfaces energized traces to any ground potential. This connector J1 must hold that tolerance as must all pins going in and out of the housing and any traces. Since elements 114, 111 and 123 are all safety rated capacitors, if a very high potential were to be placed on center conductor 64, (FIG. 6), those elements will not fail and pass the high voltage into the circuit.

Another aspect about this design is that it solves all of the requirements in terms of the RF. The complete tuner itself has upstream and downstream functions and acts as an RF interface between the cable network and a digital processor, including AC bias tap, the coupler, the relay safety caps, lightning protection, AC line cross, radiation susceptibility and mechanical rigidity. This then allows designers, who typically work in the digital realm, to be able to specify digital inputs and outputs and then to have a circuit which accepts their digital inputs, outputs and directions and provides the desired RF interface in a single package. This design also provides for a customer to have a cable drop from the cable supplier to the customer's RF facilities such as a TV, VCR, cable modems, etc. At the same time the single circuit has taps for services such as telephone and any other data services that may be required such as, for example, computer signals and other such outputs which would not be available to a customer on a typical coax line without other processing interjected into the circuit.

FIG. 4 shows one embodiment of the invention where the input area 41 is constructed using co-planer wave guide techniques, as shown in FIGS. 2 and 3. An RF section 41 using physical barrier 42 is shown to help isolate the input section from the remainder of the tuner. Other physical barriers (not shown) are typically used to isolate different parts of the tuner circuit.

FIG. 5 shows one embodiment of coaxial connector 50 where a requirement of connector 50 is that it have a flat face 70 (FIG. 7) on its outer surface 51. Connector 50, in our best mode, is the female portion of the ANSI/SCTE SP 400-1996 F-Port (female outdoor) connector. The current process for making such a connector uses a coining technique where the dielectric is loaded from the outside and then the metal jacket is coined over the dielectric. This leaves a rounded outer surface. This problem, as well as the UL electrical requirements of standard 1950, have been met by increasing dielectric 62 (FIG. 6) dimensions and loading the dielectric from the inner end and coining edge 63 at the inner end to contain dielectric 62. Outer end 51 would already be flat from its initial manufacturing processes. In addition to what we are calling the back (inner) loading of the dielectric and the coining over on the back (inner) side, the other benefit is that we open the dimensionalities around the center conductor such that center conductor 64 (FIG. 6) does not come closer than 67 mil clearance from any ground surface. That is the UL requirement for creepage and clearance as detailed in UL standard 1950. This is not a normal parameter one would find in a coaxial connector and yields low insertion loss and very good return loss which translates into a low voltage standing wave ratio (VSWR) which is not currently available. The low VSWR also means that only a small amount of RF energy is being reflected back to the source.

Connector 50 is designed with non-rotational flat slots 54, 55, formed behind relief surface 60, which slide into a housing, such as housing 80 (FIG. 8), with tabs 81 sticking out, the ends of which engage with flat surfaces 54, 55 on the connector. Housing 80, in one embodiment, forms a square opening 82 with sides 83, 84 which ideally engage with slots 55, 54, respectively. This arrangement increases the resistance of connector 50 to torque rotation. This design also locks the connector to the housing for grounding purposes for protection of high voltage lightning and line cross wiring. Threads 53 of connector 50 accept the screw end of a mating coaxial connector from the network.

FIG. 6 shows the inner end of connector 50 with surface 63 folded (coined) over dielectric 62. Ring 61 connects ring 52 to connector 50. Center conductor 64 can be bent over as shown to mate with circuitry on mounting bound 40 (FIG. 4) within housing 80 (FIG. 8).

FIG. 7 shows the outer end 51 of connector 50 with preformed flat surface 70. The inner side (not shown) of surface 70 prevents dielectric 62 from sliding out of connector 50. Dielectric 62, as discussed above, is inserted from the inner end prior to surface 63 (FIG. 6) being folded inward. The center female connector (which is the outer end of connector 64) 71A, 71B is, in one embodiment, spring loaded to receive the male mating connector (not shown) from the external network.

FIG. 8 shows a portion of housing 80, with tabs 81 and 85 forming a square opening 82 having sides 83 and 84, as discussed above, for mating with connector 50 such that high torque forces (such as when a mating connector is screwed onto threads 53 of connector 50) will not turn connector 50.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A cable interface circuit comprising:
    an RF input for accepting RF signals as well as power;
    an RF output;
    an RF tap;
    a power tap; and
    an isolation circuit for connecting said power from said RF input to said power tap while preventing said power from being delivered to either said RF output or to said RF tap, wherein said isolation circuit is constructed, at least in part, using wave guide techniques.

2. The cable interface circuit of claim 1 wherein said isolation circuit is constructed, at least in part, using a co-planar wave guide.

3. The cable interface circuit of claim 1 wherein said isolation circuit is operable for maintaining an insertion and return loss of said RF tap at less than 3.0 dB at 5 MHZ.

4. The cable interface circuit of claim 1 wherein said isolation circuit further comprises:
    over voltage protection circuitry for protection against lightning surges.

5. The cable interface circuit of claim 1 wherein said over voltage protection circuitry includes safety caps.

6. The cable interface circuit of claim 4 wherein said over voltage protection circuit delivers any said over voltage to a surge protector external to said interface circuit.

7. The cable interface circuit of claim 4 wherein said isolation circuit and at least a portion of said over voltage protection circuit are constructed using co-planar wave guide techniques.

8. The cable interface circuit of claim 1 wherein said isolation circuit further comprising:
    over voltage protection circuitry for protection against voltages greater than 600 volts.

9. The cable interface circuit of claim 8 wherein said over voltage protection circuitry includes safety caps.

10. The cable interface circuit of claim 1 wherein said interface circuit further includes:
    cut-off circuitry for selectively receiving RF signals from said RF output.

11. The cable interface circuit of claim 10 wherein said cut-off circuitry is operable under control of signals received from said RF input.

12. The cable interface circuit of claim 10 wherein said cut-off circuitry includes relay contacts.

13. The cable interface circuit of claim 1 wherein said RF tap is bidirectional.

14. The cable interface circuit of claim 1 wherein said RF tap sends RF signals to an RF receiver contained within said interface circuit and receives RF signals for delivery to said RF input from an RF transmitter contained within said interface circuit.

15. A cable interface circuit comprising:
   an RF input for accenting RF signals as well as power;
   an RF output;
   an RF tap, wherein said RF tan sends RF signals to an RF receiver contained within said interface circuit and receives RF signals for delivery to said RF input from an RF transmitter contained within said interface circuit, and wherein said RF receiver and said RF transmitter include circuitry for communicating with a processor over bidirectional digital links;
   a power tap; and
   an isolation circuit for connecting said power from said RF input to said power tap while preventing said power from being delivered to either said RF output or to said RF tap.

16. The cable interface circuit of claim 15 wherein said processor is located remote from said interface circuit.

17. The cable interface circuit of claim 16 wherein said interface circuit further includes cut-off circuitry for selectively isolating said RF output from said RF input.

18. The cable interface circuit of claim 17 wherein said cut-off circuitry is operable under control of signals from said processor.

19. The cable interface circuit of claim 14 wherein said RF tap, said isolation circuit, said RF receiver, and RF transmitter are contained within a single housing.

20. The cable interface circuit of claim 19 wherein said housing includes a first non-rotational RF network connector connected to both said housing and to said RF input.

21. The cable interface circuit of claim 20 wherein said connector meets UL standards for power contained on its center conductor.

22. The cable interface circuit of claim 20 wherein said connector includes an outdoor F-connection for mating with said network connector.

23. A self-contained device for receiving signals from a coaxial cable and for delivering received ones of said signals to a tuner within said device, said device comprising:
   an input for connection to said cable, said input including isolation circuitry for removing power from said cable and for delivery of said removed power for use in powering said device; said isolation circuitry also including circuitry for delivering lightning surge energy to a separate surge protection device; and said isolation circuitry also including circuitry for protection against voltages in excess of 600 volts, wherein said isolation circuitry is constructed using co-planar wave guides.

24. The device of claim 23 wherein said isolation circuitry includes safety caps.

25. The device of claim 23 wherein said device includes an output for connection to a receiving device, said output operational for receiving signals from said input without significant attenuation.

26. The device of claim 25 wherein said co-planar wave guides are used to direct said signals.

27. The device of claim 26 wherein said tuner is bidirectional.

28. The device of claim 27 wherein signals from said bidirectional tuner are delivered to said cable via said input and not to said receiving device and wherein signals from said input are delivered to both said receiving device and to said tuner, at least in part, by said co-planar wave guides.

29. The device of claim 28 wherein said input signals and said output to said receiving device are RF signals.

30. The device of claim 29 wherein said tuner communicates with said input via bidirectional RF signals and wherein said device further includes a digital signal output for bidirectional communication with devices external to said device.

31. The device of claim 30 wherein said device includes an RF connector rotationally and electrically locked to said device, said connector having a relatively flat outer surface for mating with a network connector.

32. The device of claim 31 wherein said connector meets UL standard 1950 for electrical creepage and clearance.

33. A method for receiving RF signals from a coaxial cable and for delivering digital representations of received ones of said signals to digital output, said method comprising the steps of:
   receiving RF signals from said cable at an RF input;
   removing any AC line power received from said cable;
   delivering any said removed power for use in powering said method;
   removing any lightning surge energy received from said cable and delivery said removed surge energy to a separate surge protection device; and
   removing any voltage in excess of 600 volts from any said received signals.

34. The method of claim 33 wherein said above-identified steps include using co-planar wave guides to transport at least a portion of said received signals.

35. The method of claim 34 wherein said removing step includes using safety caps.

36. The method of claim 34 wherein further including the step of delivery to an RF output received ones of said RF signals from said input without significant attenuation, and without any power or lightning surges present at said RF output from said input.

37. The method of claim 36 wherein said co-planar wave guides are used to deliver said RF signals to said RF output.

38. The method of claim 37 wherein input RF signals are delivered to a bidirectional tuner and wherein signals from said bidirectional tuner are delivered to said RF input and not to said RF output and wherein RF signals from said RF input are delivered to both said RF output and to said tuner, at least in part, by said co-planar wave guides.

39. The method of claim 38 wherein said method is practiced entirely within a self-contained device.

40. The method of claim 38 wherein said bidirectional timer communicates with devices external to said self-contained device via a bidirectional digital link.

41. A cable interface circuit comprising:
   an RF input for accepting RF signals as well as power;
   an RF output;
   an RF tap;
   a power tap; and
   means for connecting said power from said RF input to said power tap while preventing said power from being delivered to either said RF output or to said RF tap wherein said connecting means is constructed, at least in part, using a wave guide.

42. The cable interface circuit of claim 41 wherein said connecting means is constructed, at least in part, using co-planar wave guide techniques.

43. The cable interface circuit of claim 41 wherein said connecting means is operable for maintaining an insertion and return loss of said RF tap at less than 3.0 dB at 5 MHZ.

44. The cable interface circuit of claim 41 wherein said RF tap sends RF signals to an RF receiver contained within said interface circuit and receives RF signals for delivery to said RF input from an RF transmitter contained within said interface circuit.

45. The cable interface circuit of claim 44 wherein said RF receiver and said RF tuner include means for communicating with a processor over bidirectional digital links.

46. The cable interface circuit of claim 45 wherein said interface circuit further includes means for selectively isolating said RF output from said RF input.

47. The cable interface circuit of claim 46 wherein said isolating means is operable under control of signals from said processor.

* * * * *